US008670732B2

(12) United States Patent
Borodulin et al.

(10) Patent No.: US 8,670,732 B2
(45) Date of Patent: Mar. 11, 2014

(54) BROADBAND AMPLIFIER SYSTEM USING A 3DB QUADRATURE COMBINER TO DYNAMICALLY MODULATE LOAD IMPEDANCE

(75) Inventors: Dmitri Borodulin, South Lebanon, OH (US); George Cabrera, Mason, OH (US)

(73) Assignee: HBC Solutions, Inc., Englewood, CO (US)

( * ) Notice: Subject to any disclaimer, the term of this patent is extended or adjusted under 35 U.S.C. 154(b) by 48 days.

(21) Appl. No.: 13/294,541

(22) Filed: Nov. 11, 2011

(65) Prior Publication Data
US 2013/0122834 A1 May 16, 2013

(51) Int. Cl.
*H01Q 11/12* (2006.01)
*H04B 1/04* (2006.01)

(52) U.S. Cl.
USPC ............... 455/127.1; 455/114.3; 375/297

(58) Field of Classification Search
USPC .......... 455/114.2, 114.3, 127.1–127.3, 127.5; 375/296, 297
See application file for complete search history.

(56) References Cited

U.S. PATENT DOCUMENTS

| 6,711,392 B1 * | 3/2004 | Gillis ........................ 455/253.2 |
| 6,894,562 B2 | 5/2005 | Nakayama et al. |
| 6,954,623 B2 | 10/2005 | Chang et al. |
| 7,102,444 B2 | 9/2006 | Shanjani et al. |
| 7,262,656 B2 | 8/2007 | Shiikoma |
| 8,005,445 B2 * | 8/2011 | Kuriyama et al. ......... 455/127.3 |
| 8,049,565 B2 | 11/2011 | Zhang et al. |
| 2004/0189381 A1 | 9/2004 | Louis |
| 2005/0134377 A1 | 6/2005 | Dent |
| 2005/0225387 A1 * | 10/2005 | Ueno et al. ..................... 330/149 |
| 2006/0238245 A1 | 10/2006 | Carichner |
| 2007/0205827 A1 | 9/2007 | Mobbs |
| 2009/0149144 A1 * | 6/2009 | Luz et al. ...................... 455/216 |
| 2010/0130145 A1 | 5/2010 | Jang |
| 2010/0289571 A1 | 11/2010 | Hong et al. |
| 2011/0095828 A1 | 4/2011 | Zhang et al. |

FOREIGN PATENT DOCUMENTS

| EP | 2169823 A1 | 3/2010 |
| WO | WO 2004/088837 A2 | 10/2002 |

OTHER PUBLICATIONS

Burns, "Highly Efficient Amplifier Shows he Promise of Doherty Architecture", www.rfdesign.com, Jun. 2007, 3 pages.
Mitzlaff, et al., "Novel Combiner Circuits for a Doherty RF Power Amplifier", www.ip.com—Prior Art Database, Jul. 22, 2002, 12 pgs.

* cited by examiner

*Primary Examiner* — Nhan Le
(74) *Attorney, Agent, or Firm* — Tarolli, Sundheim, Covell & Tummino LLP

(57) ABSTRACT

Systems and methods are provided for modulating a radio frequency (RF) carrier signal with a baseband input signal and amplifying the modulated RF carrier signal to provide an amplified RF signal. A quadrature combiner is configured to provide the amplified RF signal at an associated output port. A main amplifier is configured to receive a first modulated RF signal and provide a main output to one of a through port and a coupled port of the quadrature combiner. An auxiliary amplifier is configured to receive a second modulated RF signal and provide an auxiliary output to an isolation port of the quadrature combiner.

16 Claims, 5 Drawing Sheets

US 8,670,732 B2

BROADBAND AMPLIFIER SYSTEM USING A 3DB QUADRATURE COMBINER TO DYNAMICALLY MODULATE LOAD IMPEDANCE

TECHNICAL FIELD

The present invention relates to radio frequency (RF) communication systems and is particularly directed to systems and methods for high power amplification of RF signals.

BACKGROUND OF THE INVENTION

An electronic amplifier is a device for increasing the power of a signal. Generally, an amplifier outputs energy from a provided power supply and controls the output to match an associated shape of an input signal with a larger amplitude. There are many types of electronic amplifiers, and they are commonly used in radio and television transmitters and receivers, high-fidelity stereo equipment, microcomputers and other electronic digital equipment, and audio amplifiers.

SUMMARY OF THE INVENTION

In accordance with an aspect of the present invention, a system is provided for modulating a radio frequency (RF) carrier signal with a baseband signal and amplifying the modulated RF carrier signal to provide an amplified RF signal. A quadrature combiner is configured to provide an output signal at an associated output port. A first main amplifier is configured to receive a first modulated RF signal and provide a first output to a through port of the quadrature combiner. A second main amplifier is configured to receive the first modulated RF signal and provide a second output to a coupled port of the quadrature combiner. An auxiliary amplifier is configured to receive a second modulated RF signal and provide a third output to an isolation port of, the quadrature combiner.

In accordance with another aspect of the present invention, a method is provided for modulating an RF carrier signal with a baseband input signal and amplifying the modulated RF carrier signal. A first modulated RF signal is provided to a main amplifier to provide a main output. A second modulated RF signal is provided to an auxiliary amplifier to provide an auxiliary output. The main output is provided to one of a through port and a coupled port of a quadrature combiner. The auxiliary output is provided to an isolation port of the quadrature combiner.

In accordance with yet another aspect of the present invention, a system is provided for modulating a radio frequency (RF) carrier signal with a baseband input signal and amplifying the modulated RF carrier signal to provide an amplified RF signal. A quadrature combiner is configured to provide the amplified RF signal at an associated output port. A main amplifier is configured to receive a first modulated RF signal and provide a main output to one of a through port and a coupled port of the quadrature combiner. An auxiliary amplifier is configured to receive a second modulated RF signal and provide an auxiliary output to an isolation port of the quadrature combiner.

BRIEF DESCRIPTION OF THE DRAWINGS

The foregoing and other features of the present invention will become apparent to those skilled in the art to which the present invention relates upon consideration of the following description of the invention with reference to the accompanying drawings, wherein.

DESCRIPTION OF THE PREFERRED EMBODIMENT

In television broadcast industry, cellular communications, cable signal distribution etc., RF communication signals can include many frequency carriers that are amplified simultaneously. The signals can occupy a wide RF bandwidth. An RF signal that includes a sum of the carriers is characterized by high Peak-to-Average Power Ratio (PAPR). A single TV channel includes many (thousands) spectral carriers tightly spaced over 8 MHz frequency range. To achieve low in-band intermodulation distortions (IMD), the amplifier should be linear and have peak power capability to handle amplitude modulated RF signal that has PAPR=8 dB or higher. This restricts overall DC-RF efficiency of RF amplifier to relatively low values. In addition, to have transmitters that can operate at any channel within UHF or VHF frequency range without component adjustments the amplifier should be broadband.

In accordance with an aspect of the present invention, an output power combining technique is illustrated to expand the possibility of the lossless load pulling to the frequency range boundaries of a 3 dB 90° directional coupler. As a result, a load pulling technique that extends the Efficient Dynamic Range (EDR) of the amplifier becomes applicable over a frequency range of a 3-dB directional coupler and can achieve 100% bandwidth or even more by adding sections to the directional coupler.

Figure 1:
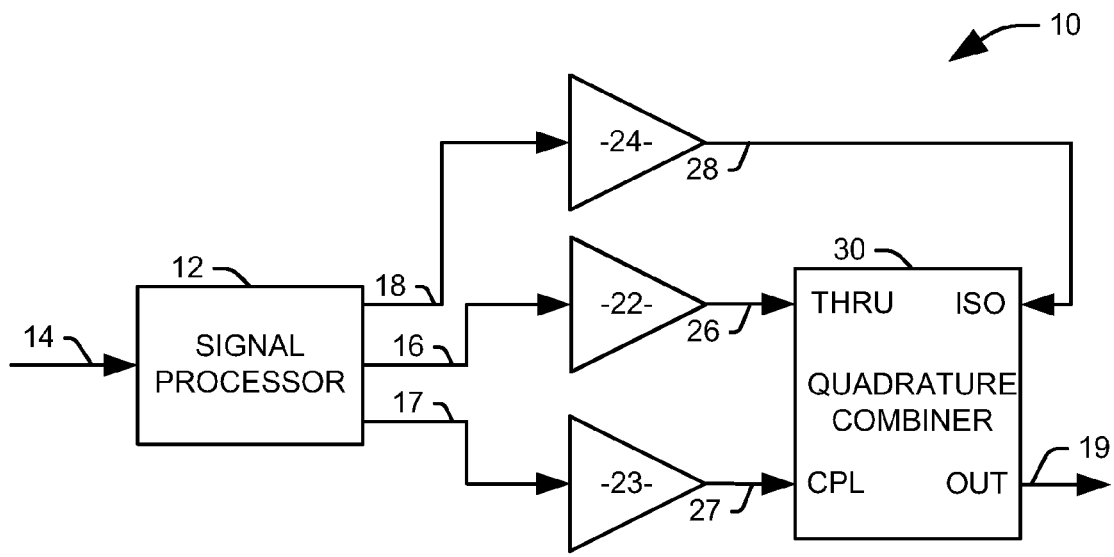
FIG. 1 is a functional block diagram of a multiple amplifier system in accordance with an aspect of the present invention.

FIG. 1 is a functional block diagram of a multiple amplifier system 10 in accordance with an aspect of the present invention. The system 10 includes a signal processor 12 configured to receive an baseband input signal 14 and produce at least first, second, and third intermediate RF signals 16-18 with amplitude modulation representing the input baseband signal. By "representing the input baseband signal" it is meant that the amplitude modulations of the intermediate signals 16-18 are derived from the input baseband signal as a function of it. The resulting amplitude modulation of an output RF signal 19 becomes a replica of input baseband signal.

The first and second intermediate RF signals 16 and 17 are provided as inputs to respective first and second main amplifiers 22 and 23. The third intermediate RF signal 18 is provided as an input to an auxiliary amplifier 24. Each of the amplifiers 22-24 includes an active RF power generating device, such as a bipolar junction transistor (BJT), a metal-oxide semiconductor field effect transistor (MOSFET), or an electronic tube. Each amplifier 22-24 provides an output RF signal 26-28 representing an amplified version of its respective intermediate RF signal 16-18.

The outputs 26-28 of the two amplifiers are delivered to the corresponding inputs of a 3-dB quadrature combiner 30. In accordance with an aspect of the present invention, a first output 26, from the first main amplifier 22, is provided to a through port of the direction coupler 30 and a second output 27, from the second main amplifier 23, is provided to a coupled port of the quadrature combiner 30. A third output 28 from the auxiliary amplifier 24 can be provided to an isolation port of the quadrature combiner 30. The output port of the quadrature combiner 30 provides an output signal 32 representing an amplified reconstruction of the input signal 14 from the outputs 26-28 of the amplifiers 22-24.

Figure 2:
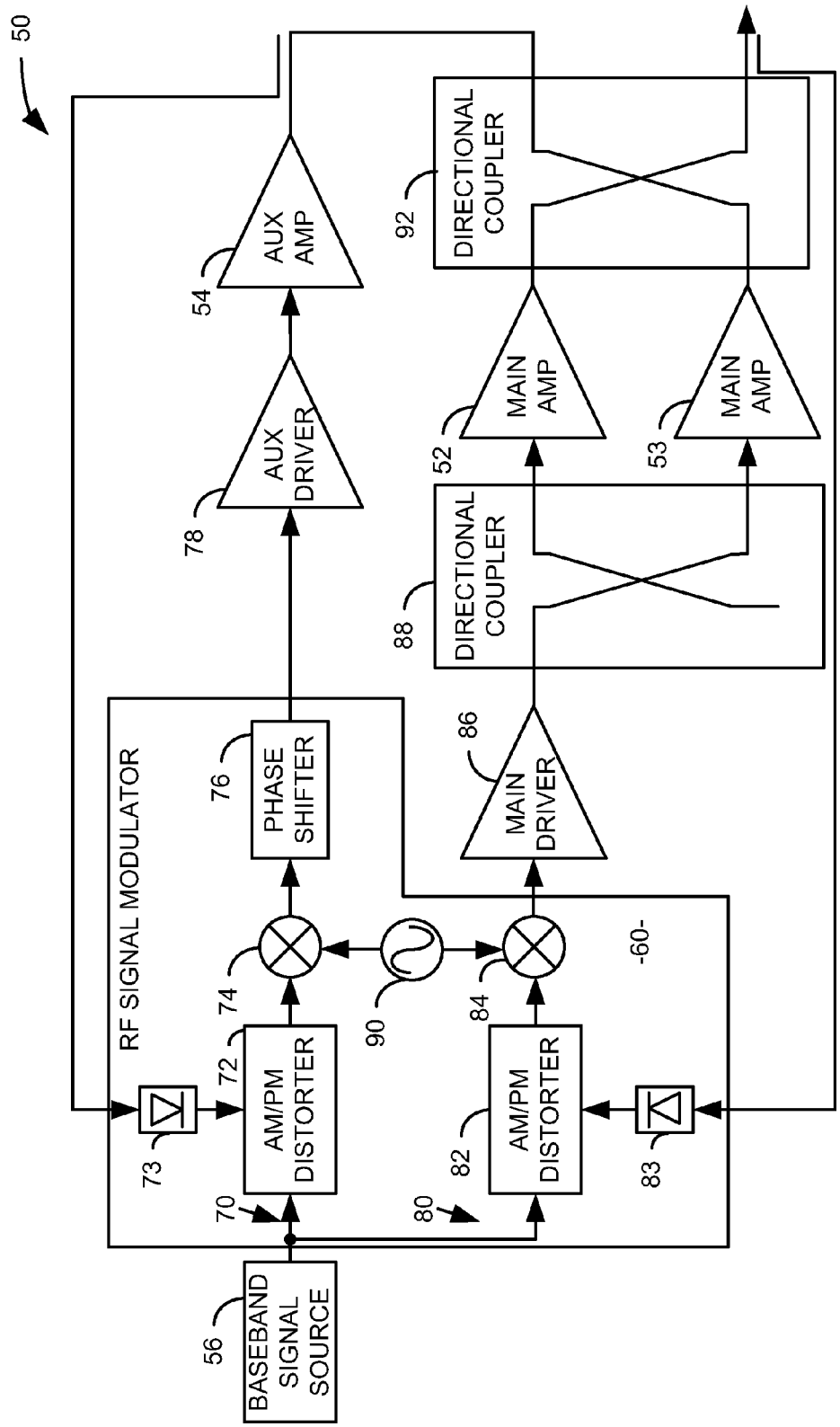
FIG. 2 is a functional block diagram of one implementation of a multiple amplifier system in accordance with an aspect of the present invention.

FIG. 2 is a functional block diagram of one implementation of an amplifier system 50 (in accordance with an aspect of the present invention. In the illustrated system, three power amplifiers 52-54 are used to amplify an input signal generated from an associated baseband signal source 56, including two main amplifiers 52 and 53 and an auxiliary amplifier 54. It will be appreciated that the amplifiers 52-54 can include any appropriate assemblies for high power amplification of RF signals. For example, each amplifier 52-54 can contain one or more active devices, a direct current (DC) power supply for the active devices, and appropriate impedance matching circuitry at the input and output of the device. In the illustrated implementation 50, the active devices are metal-oxide semiconductor field effect transistor (MOSFET) devices, although it will be appreciated that other active devices can be used, such as bipolar junction transistors (BJTs), junction gate field effect transistors (JFETs), or vacuum tubes.

The baseband input signal is provided to a radio frequency (RF) modulation component 60 configured to provide one or both of amplitude modulation (AM) and phase modulation (PM) to the input signal and distributes the signal along main and auxiliary paths. The RF modulation component 60 distributes the signal along an auxiliary signal path 70 and a main signal path 80. The auxiliary signal path 70 includes an auxiliary path predistorter 72 configured to provide a predistortion to the provided signal. In one implementation, the auxiliary path predistorter 72 distorts the signal such that the auxiliary path 70 provides a non-zero amplitude only when the input signal exceeds a certain threshold amplitude. It can also scale the amplitude of the signal. The auxiliary path predistorter 72 can also provide amplitude and phase predistortion to the baseband input signal to correct for distortion introduced by the auxiliary amplifier. This predistortion can be dynamic, with an output of the auxiliary amplifier 54 sampled and provided to the auxiliary path predistorter 72 through a downconverter 73.

The output of the auxiliary path predistorter 72 can be provided to a first modulator 74. The first modulator 74 is configured to apply amplitude and phase modulation to a carrier signal, provided by a local oscillator 90, to represent a desired signal content, represented by the baseband signal. It will be appreciated that the first modulator 74 can include components for upconverting the baseband input signal, frequency stabilization techniques, phase-locked loops, numerical control of the local oscillator 90, filtering, mirror image rejection, and any other function useful for modulating the carrier signal.

A phase shifter 76 can be used to adjust the phase of the auxiliary signal path relative to the main signal path such that a desired 180° phase between the signal provided by the auxiliary amplifier 54 and the signals provided by each of two main amplifiers 52 and 54 can be achieved at the corresponding output port of active device inside of each of two main amplifiers. In the illustrated implementation, the signals are maintained out of phase (i.e., at a relative phase of one hundred eighty degrees).

The phase shifted signal is provided to an auxiliary driver amplifier 78 that provides a preliminary amplification to the auxiliary path signal before providing it to the auxiliary amplifier 54. In the illustrated implementation, one or more active devices within the auxiliary amplifier 54 are biased for class C operation, although it will be appreciated that other configurations are possible in systems in accordance with an aspect of the present invention.

The main signal path includes a main path predistorter 82 configured to provide amplitude and phase predistortion to the baseband input signal. For example, the main path predistorer 82 can correct for distortion introduced by the main amplifiers 52 and 53 and other components 84, 86, and 88 on the main signal path. This predistortion can be dynamic, with an output of the system 50 sampled and provided to the main path predistorter 82 through a downconverter 83.

A second modulator 84 is configured to apply amplitude and phase modulation to the carrier signal to represent the desired signal content. It will be appreciated that, like the first modulator 74, the second modulator 84 can include components for upconverting the baseband input signal, frequency stabilization techniques, phase-locked loops, numerical control of the local oscillator 90, filtering, mirror image rejection, and any other function useful for modulating the carrier signal. The modulated signal is provided to a main driver amplifier 86 that provides a preliminary amplification to the main path signal. The output of the main driver amplifier is provided to a quadrature splitter, such as a first directional coupler 88, configured to evenly distribute the signal between inputs of two main amplifiers 52 and 53. For example, the first directional coupler 88 can be a 3-dB ninety degree hybrid coupler. It will be appreciated that the two main amplifiers 52 and 53 can be configured to operate in class AB.

The outputs of the main amplifiers 52 and 53 are provided to a second directional coupler 92 as first and second inputs. The main amplifiers can be selected to be similar in construction and contain the same components, and thus have similar features, including gain, impedances, and power. Specifically, the outputs of the main amplifiers are provided to the through and coupled ports of the second direction coupler 92. In accordance with an aspect of the present invention, the output of the auxiliary amplifier 54 is provided to an isolation port of the second directional coupler 92. The signal provided at the isolation port modulates the load impedance presented at the output port of the active device inside of the main amplifiers, allowing for increased power output from the system.

In one implementation, when both main amplifiers operate in linear mode and RF signal is below the level that is required to put them into voltage saturation mode, the main path is active and auxiliary path is muted. Both main amplifiers 52 and 53 deliver a mutually balanced radio frequency (RF) signal at corresponding ports of the second directional coupler 92. The impedance presented at the output of each main amplifier 52 and 53 is the load impedance, designated here as $Z_0$, as long as both main amplifiers deliver an equal amplitude RF signal with a ninety degree phase difference.

It will be appreciated that an amplifier is most efficient when operating in or close to voltage saturation mode. To further increase the power emitted by the system, and remain in voltage saturation mode for high efficiency, the load impedance presented at the output port of the active device inside of the main amplifiers 52 and 53 is reduced. In accordance with an aspect of the present invention, this can be accomplished by exciting the auxiliary amplifier 54 with the same RF signal that is supplied to the main amplifiers 52 and 53, applied at the amplitude and phase distorter 72, such that a non-zero amplitude RF signal is applied to the isolation port of the second directional coupler 92 at the moment when the active devices inside the main amplifiers 52 and 54 are operating close to voltage saturation mode.

The signal output by the auxiliary amplifier propagates through the second directional coupler 92 and arrives at the output ports of main amplifiers 52 and 53, specifically to the output port of the active device or devices inside of each main amplifier, changing the load impedance presented at the port. The direction of the change is determined by the phase relationship between signals at the output port of the active device inside of the main amplifiers 52 and 53. If the signals are out-of-phase, the impedance drops.

The impedance presented at the output port of the active device inside of the main amplifier in voltage saturation mode, $Z_{m\_sat}$, can be expressed as a function of the voltage of the auxiliary amplifier output, $V_{aux}$, the voltage generated by the main amplifiers at the output port of the active device when operating in saturation, $V_{m\_sat}$, and the nominal impedance presented at the output port of the main amplifier when no signal is received from the auxiliary amplifier, $Z_0$ as:

$$Z_{m\_sat} = Z_0 \frac{V_{m\_sat}(1+S_{12})}{V_{m\_sat}(1-S_{21}) - \sqrt{2} \cdot V_{aux} \cdot S_{22}} \quad \text{Eq. 1}$$

where $$\begin{pmatrix} S_{11} & S_{12} \\ S_{21} & S_{22} \end{pmatrix}$$

are scattered parameters that describe output matching network of each main amplifier.

It will be appreciated from that when the auxiliary amplifier is producing no signal, the impedance is unchanged. When the signal from the auxiliary amplifier 54 is in-phase with the signal from main amplifier 52 and 53, the impedance is increased. When the signal from the auxiliary amplifier 54 is out-of-phase with the signal from the main amplifier 52 and 53, and the impedance is decreased.

An active RF power device operating in a voltage saturation mode becomes more or less a voltage source and as such exhibits very low output impedance. Therefore, each main amplifier 52 and 53 can be considered as RF voltage source when the amplitude of the output signal of active devices situated inside of the amplifiers reaches the voltage limit. The voltage limit is set by the DC power supply that feeds the output electrode of the active device or devices.

A typical value of output impedance of a voltage saturated active RF power device is between 0.1 ohm and 0.3 ohm. A typical value of the load impedance presented at the output of this device is from 5 ohm to 10 ohm. Therefore, the typical load line impedance can be thirty to fifty times the output impedance of the device. Hence, an active device operating in saturation mode can be qualified as a fairly good voltage source. Accordingly, the amplitude of the RF voltage at the output port of the device can be expected to be substantially constant and any RF signal applied from an external power source to the output port of the device will be reflected back due to high reflection coefficient. The phase of the reflected signal will be shifted by one hundred eighty degrees.

In accordance with an aspect of the present invention, the RF signal generated by auxiliary amplifier 54 is combined in-phase with the signals generated by main amplifiers 52 and 53 at the output port of the second directional coupler 92. As discussed previously, the phase shifter 74 allows adjustment of the phase of the auxiliary signal path 70 relative to the main signal path 80. The phase is selected such that the signals generated by auxiliary amplifier 54 and the main amplifiers 52 and 53 are exactly out-of-phase at the output port of an active device inside of each main amplifier active device. After being reflected, the RF signal of auxiliary amplifier changes phase 180° and propagates along with the RF signals generated by the main amplifiers to the output load.

The amount of power generated by each main amplifier in voltage saturated mode, $P_{msat}$, can be expressed as:

$$P_{msat} = \frac{P_{m\_o}}{r} \quad \text{Eq. 2}$$

where $P_{m\_o}$ is a maximum power provided by a main amplifier when the auxiliary amplifier is mute, and $$r = \frac{Z_{m\_sat}}{Z_{m\_o}} = \frac{V_{msat}(1-S_{21})}{V_{m\_sat}(1-S_{21}) - \sqrt{2} \cdot V_{aux} \cdot S_{22}}$$

is an impedance modulation index.

The voltage of the combined signal, $V_{out}$, at the output of the second directional coupler 92 that is terminated to a matching load can be represented as:

$$V_{out} = -j \frac{S_{21}}{1+S_{11}} \left( \sqrt{2} \, V_{m\_sat} - V_{aux} S_{12} \right) + S_{22} V_{aux} \quad \text{Eq. 3}$$

The corresponding output power, $P_{out}$, can be represented as:

$$P_{out\_} = \text{Re} \frac{\left[ \frac{S_{12}}{1+S_{22}} \left( \sqrt{2} \, V_{m\_sat} - V_{aux} S_{22} \right) + S_{22} V_{aux} \right]^2}{Z_{m\_sat}} \quad \text{Eq. 4}$$

The maximum value of $P_{out}$, which corresponds to a maximum input voltage, $V_{in\_max}$, is represented as:

$$P_{out\_max} = \quad \text{Eq. 5}$$

$$2 \cdot \text{Re} \left\{ \frac{V_{m\_sat}^2}{Z_0} \cdot \left[ \frac{S_{21}}{1+S_{11}} - \frac{(1-S_{11})(r-1)}{2r} \left( \frac{S_{21}}{1+S_{11}} - \frac{S_{22}}{S_{12}} \right) \right]^2 \right\}$$

Figure 3:
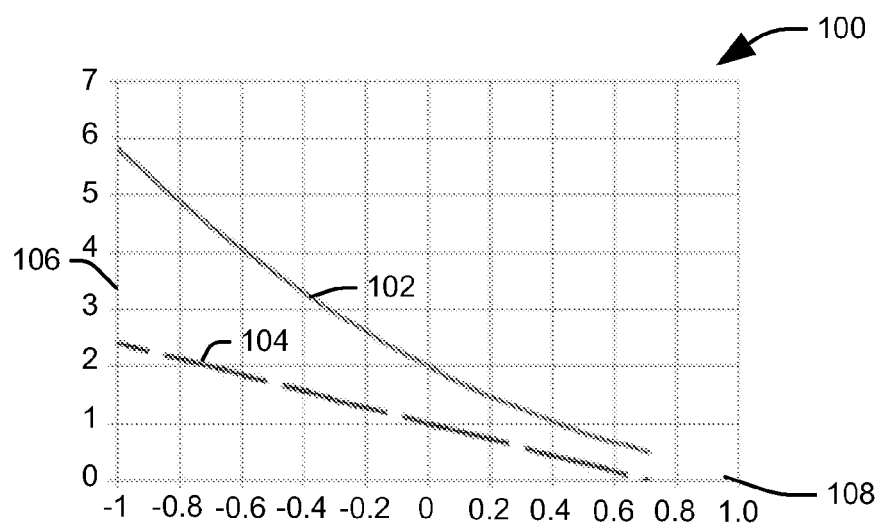
FIG. 3 is a chart illustrating a normalized power output of the system and each main amplifier for the system of FIG. 2 as a function of the normalized voltage provided by the auxiliary amplifier.

FIG. 3 is a chart 100 illustrating a normalized power output of the system 102 and each main amplifier 104 for the system of FIG. 2 as a function of the normalized voltage provided by the auxiliary amplifier for the simple case when output matching network does not exist and output port of Active Device of each Main amplifier is connected directly to the corresponding input port of output combiner. By a normalized power level, it is meant the power level emitted for a nominal load impedance of one ohm. In the chart 100, the vertical axis 106 represents the power level delivered to one ohm load, and the horizontal axis 108 represents a ratio of the voltage output by the auxiliary amplifier to the voltage output by each main amplifier. The normalized power provided by a given main amplifier is represented by a broken line, and the total power provided by the system is represented as a solid line.

When the auxiliary amplifier is mute, represented by zero on the horizontal axis 108, it can be seen from the chart that the normalized power level at the output of each main amplifier is equal one. When the auxiliary amplifier is turned on, supplying a signal with the phase opposite to the phase of the signal generated by the active device or devices in the main amplifier, the impedance at the output port of the active device drops and the power level grows accordingly. If the active device is operating in voltage saturation mode, the voltage generated by the active device will remain constant. Hence, the power generated by the active device will grow inversely proportional to the load impedance. At the moment when the amplitudes of the voltages of the two signals are equal and the signals are out-of-phase, represented by negative one on the horizontal axis 108, the impedance value is reduced by a factor of 2.414 and the power generated by each main amplifier grows proportionally. This power growth occurs while both main amplifiers operate in the high efficiency saturation mode. The signal at the output of the system has a power level that is a sum of the signal power levels from the auxiliary amplifier and the two main amplifiers. Each main amplifier delivers a normalized power of around 2.4 watts when the auxiliary amplifier delivers 1 watt. Therefore, the total delivered power to the output load is 5.8 W. The Efficient Dynamic Range (EDR) is the ratio of highest output power level to the lowest power level that was produced while in voltage saturation mode.

The EDR is 5.8 W/2 W=2.9. Expressed in dB, this corresponds to the total power range of high efficiency operation in this implementation, 4.65 dB.

In another implementation, the same active device can be used in each of the main and auxiliary amplifiers 52-54, and the amplifiers can be operated such that power peaks are shared equally among all amplifiers. For a simple case of active devices connected directly to the corresponding inputs of the output combiner the voltage provided by the main amplifier, $V_{main\_sat}$, can be expressed as a function of the voltage provided by the auxiliary amplifier, $V_{aux}$, as:

$$V_{main\_sat} = \frac{\sqrt{1+2V_{aux}^2} + V_{aux}}{\sqrt{2}} \quad \text{Eq. 6}$$

In this arrangement, when the voltage emitted by the auxiliary amplifier has a magnitude of one volt and is one hundred eighty degrees out-of-phase with the output of the main amplifier (e.g., $V_{aux}$=−1), the output of the main amplifier will be 0.518 volts. Using these voltages in Equation 1 above, it can be determined that the impedance seen at the outputs of the main amplifiers is reduced by approximately a factor of four, the normalized power provided by each amplifier is equal to one watt, and the total normalized power provided by the system is three watts. The normalized power provided by the main amplifiers prior to the activation of the auxiliary amplifier is equal to the 0.518 volt saturation voltage of the main amplifier squared and divided by the nominal impedance of one ohm, equal to 0.268 watts. The output power range over which this implementation operates with high efficiency can be determined as the maximum power for the system divided by twice the saturation power level of each main amplifier (assuming two main amplifiers), or 3 W/(2*0.268 W)=5.59 or 7.49 dB.

RF communication signals created with digital modulation techniques can be characterized by a Peak-to-Average Power Ratio (PAPR). The high definition television broadcast industry employs such modulation standards, for example, in the Very High Frequency (VHF) and Ultra High Frequency (UHF) bands. One example would be the Digital Video Broadcasting-Terrestrial (DVB-T) modulation used in many countries around the world. A single TV channel can include many spectral carriers (e.g., thousands) tightly spaced over an 8 MHz frequency range. To maintain in-band intermodulation distortions (IMD) under the industry specified limit the amplified broadcasted signal should be linear and have PAPR of 8 dB or higher. Another example is the 8-level vestigial sideband modulation (8-VSB) standard, which is used in USA and Mexico to broadcast TV over the air. To meet IMD requirements the transmitted signal should have PAPR of 6 dB or higher. Currently used Class AB RF amplifiers operate at average power levels backed off from their peak power capability by the factor of PAPR. By using our dynamic load impedance modulation technique the power capability of the auxiliary amplifier can be scaled to modulate load impedance of main amplifiers over a desired range. As a result of this the main amplifiers would operate at voltage saturation mode over most of output power range—from the average to the peak level, contributing to the overall system efficiency.

In addition, this method is not frequency sensitive. By adjusting the phase shift of the RF signal that propagates through the auxiliary path a wide range of carrier frequencies can be used. Most countries have their frequency range allocated for television (TV) channels that spans from 470 MHz to 862 MHz at UHF and from 175 MHz to 252 MHz at VHF. The TV allocated frequency span at UHF is 59% wide and at VHF is 36% wide. In accordance with an aspect of the present invention, a high efficiency amplifier can operate at a frequency range as wide as the bandwidth of 3-dB directional coupler, which can be 100% or even more by adding sections to the input and output 3-dB directional couplers, allowing for a transmitter to operate across a given allotted frequency span without any hardware adjustment.

To this end, an optimal ratio of the maximum power provided from the auxiliary amplifier, $P_{aux\_max}$, to the maximum power provided by the main amplifier, $P_{main\_max}$, can be determined based upon a desired Efficient Dynamic Range (EDR). If we set EDR=PAPR for an application, the following equation describes the relationship between $P_{main\_max}$ and $P_{aux\_max}$ as:

$$\frac{P_{aux\_max}}{P_{main\_max}} = 2\frac{\left(1-10^{-\frac{PAPR}{20}}\right)^2}{1-2\left(1-10^{-\frac{PAPR}{20}}\right)} \quad \text{Eq. 7}$$

where PAPR is expressed in decibels.

As will be seen from Equation 7, for a desired PAPR of 6 dB, the desired power ratio provided from the auxiliary amplifier to power provided by each main amplifier is approximately 0.662. To meet this requirement, the auxiliary amplifier should be configured to deliver approximately two-thirds of the power level of the Main Amplifier, and have an output matching network optimized for the corresponding power level. At the same time the active device used in the auxiliary amplifier can have two-thirds of the power rating of the active device used in the main amplifier.

Using an unequal number of the same active devices in the main and auxiliary amplifiers allows for a higher PAPR with high efficiency performance. For example, if number of active devices in the auxiliary amplifier is twice the number of active devices in each Main Amplifiers, the PAPR grows to 6 dB, assuming that the active devices inside the auxiliary amplifier are connected in parallel.

FIGS. 4-7 are charts 210, 220, 230, and 240 illustrating the behavior of a system utilizing the auxiliary amplifier to reduce the load impedance presented at an output port of the active devices of the main amplifiers. The horizontal axis 202 of each chart represents a voltage of the input signal, and the charts are aligned such that horizontal axes are scaled equally and corresponding values on the horizontal axes coincide. It will be appreciated that all of the values are normalized to a nominal impedance of one ohm and a maximum output RF voltage for each main amplifier of one volt. One of skill in the art, from this simplified example, will understand the operation of the system described herein.

A first input voltage value, corresponding to the input voltage at which the main amplifiers are halfway to saturation, is represented by a first vertical dotted line 204. A second input voltage value, corresponding to the input voltage at which the main amplifiers reach saturation, is represented by a second dotted line 205. A third input voltage value, corresponding to a maximum input voltage, is represented by a third dotted line 206.

Figure 4:
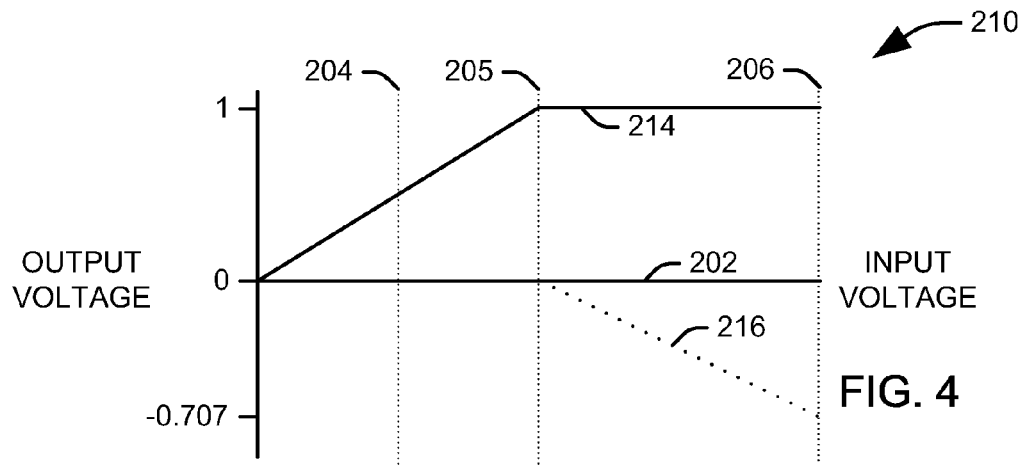
FIGS. 4-7 are charts illustrating the behavior of a system utilizing an auxiliary amplifier to reduce a load impedance of two power amplifiers that form the main power amplifier.

FIG. 4 is a chart 210 illustrating the output voltage, represented by the vertical axis 212, produced by each main amplifier 214 and the auxiliary amplifier 216. In this example, the output of the main amplifiers 214 increases linearly with the input until the main amplifiers reach saturation at the second input voltage value 205. At the second input voltage value 205, the auxiliary amplifier is driven one hundred eighty degrees out-of-phase with the main amplifiers. The output of the auxiliary amplifier is increased linearly with the increase in the input voltage until the auxiliary amplifier achieves saturation at the maximum input voltage value 206.

Figure 5:
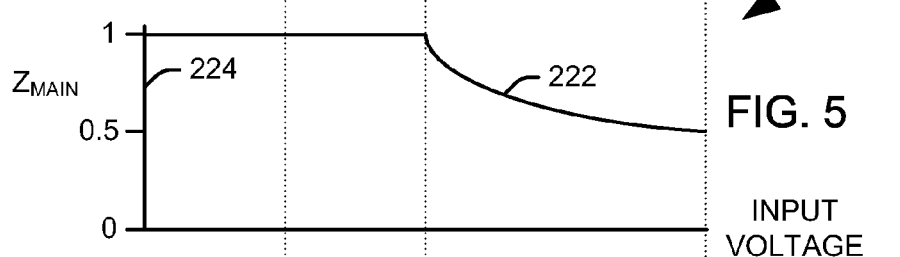

FIG. 5 is a chart 220 illustrating the normalized impedance 222 at the outputs of the main amplifiers, represented by the vertical axis 224. So long as the auxiliary amplifier is mute, the impedance remains at the nominal impedance of one. Once the main amplifier reaches saturation at the second input voltage value 205, the auxiliary amplifier is driven out of phase with the main amplifiers, reducing the impedance at the outputs of the active devices within the main amplifiers. When the auxiliary amplifier reaches saturation at the maximum input voltage value 206, a minimum impedance of 0.5 is achieved.

Figure 6:
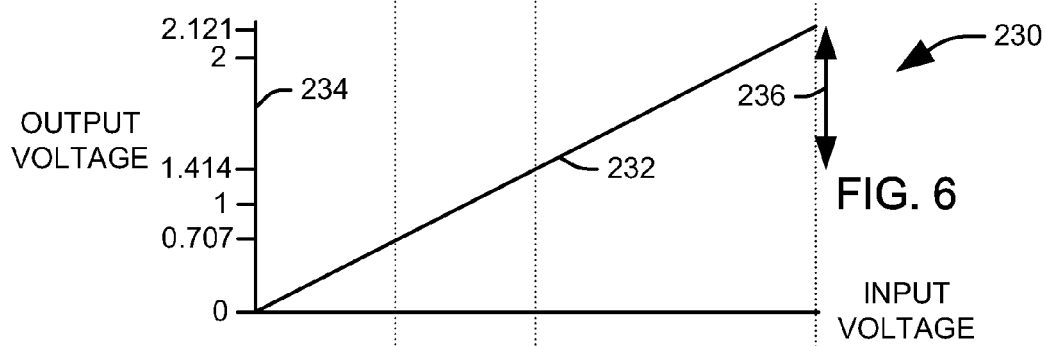

FIG. 6 is a chart 230 illustrating the normalized output voltage 232, represented by the vertical axis 234, produced by the system. It will be appreciated that the system voltage at and below the second input voltage value 205 is simply the sum of the outputs of the main amplifier. At second input voltage value 205, the main amplifiers reaches saturation, and the auxiliary amplifier becomes active. The total output of the system is equal to $\sqrt{2}V_{main\_sat}$, or 1.414 on the normalized chart. Above the second threshold input voltage 205, the auxiliary amplifier contributes to the system output 232, which reaches a maximum value of $\sqrt{2}V_{main\_sat} - V_{aux\_sat}$ at the peak input voltage 206, where the output of the auxiliary amplifier is out-of-phase with the output of the main amplifier, and thus represented as a negative voltage. It will be appreciated that the system is operating within its efficient range of the system at all voltages above the second input voltage value 205, providing an efficient dynamic range 236 of around 3.52 dB.

Figure 7:

FIG. 7 is a chart 240 illustrating the efficiency 242, represented by the vertical axis 244, of the amplifier system of FIG. 2 operated as shown in FIG. 4. It will be appreciated that the efficiency up until the second threshold voltage 206 is what would be expected from the two main amplifiers, biased in class AB. As the auxiliary amplifier becomes active, the efficiency dips slightly, returning to the peak value when all three amplifiers are in saturation at the peak input voltage value 206. Yet another method, in accordance with an aspect of the present invention, to satisfy high PAPR requirements is to modify the modulation envelope of the signal delivered through the auxiliary amplifier to dynamically pull the load impedance for the main amplifier in both directions, increasing load impedance for lower portion of the amplitude envelope and reducing load impedance for the higher amplitude part of the envelope.

As can be seen from Equation 1, the load impedance at the output of the main amplifier can be increased if the outputs of the main and auxiliary amplifiers are in-phase. By increasing the load impedance, the main amplifiers can operate in saturation mode, with the attendant gains in efficiency, at a lower power level. Modifying amplitude and phase of the signal delivered by the auxiliary amplifier as a function of the input amplitude envelope we can increase Efficient Dynamic Range. The resulting EDR can be extended from 4.64 dB to 7.64 dB and more.

Figure 8:
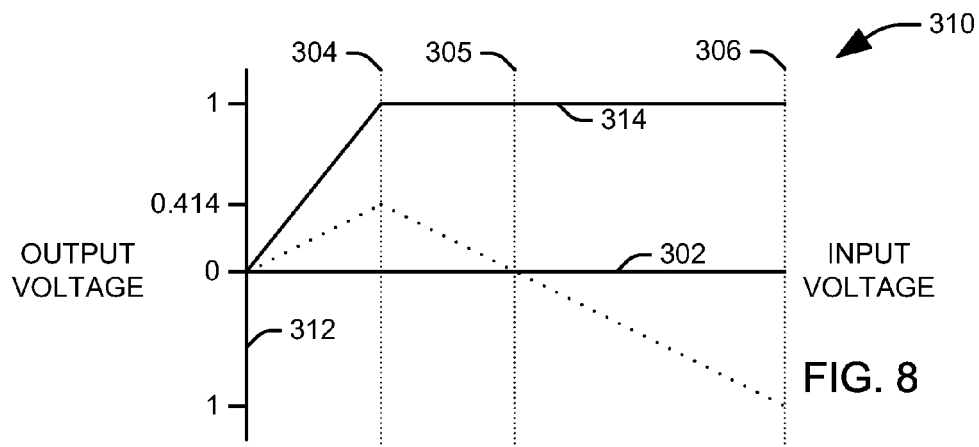
FIGS. 8-10 are charts illustrating the behavior of a system utilizing an auxiliary amplifier to modulate load impedance of two power amplifiers that form the main power amplifier
Figure 9:
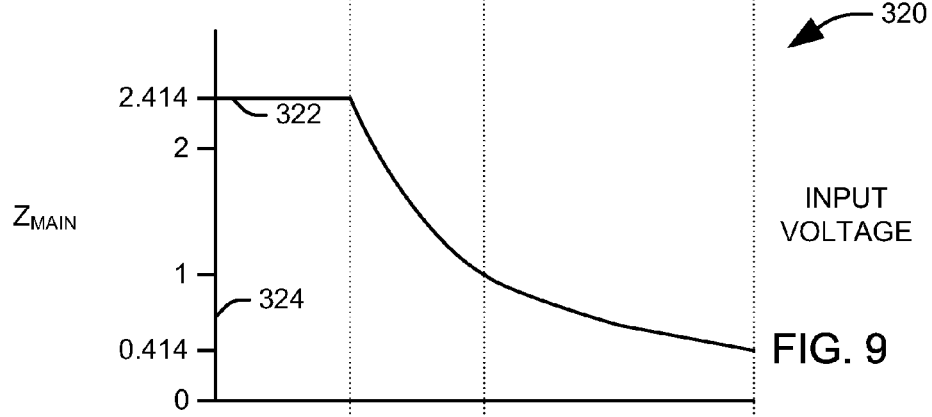
Figure 10:
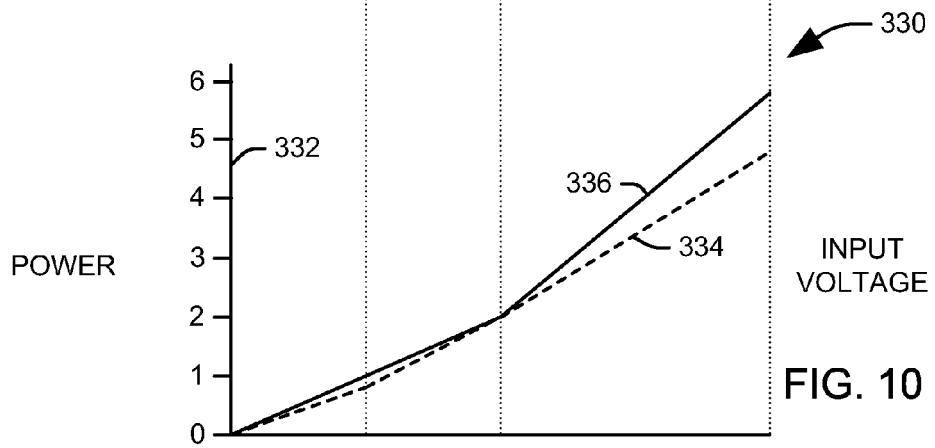

FIGS. 8-10 are charts 310, 320, and 330 illustrating the behavior of a system utilizing the auxiliary amplifier to modulate the load impedance. The horizontal axis 302 of each chart represents a voltage of the input signal, and the charts are aligned such that horizontal axis are scaled equally and corresponding values on the horizontal axes coincide. It will be appreciated that all of the values are normalized to a nominal impedance of one ohm and a maximum output RF voltage for each main amplifier of one volt. One of skill in the art, from this simplified example, will understand the operation of the system described herein.

A first input voltage value, corresponding to the input voltage at which the main amplifiers reach saturation, is represented by a first vertical dotted line 304. A second input voltage value, corresponding to the input voltage at which the output of the main amplifiers operating in saturation and absent any contribution from the auxiliary amplifier provides an amplified output representative of the input voltage, is represented by a second dotted line 305. A third input voltage value, corresponding to a maximum input voltage, is represented by a third dotted line 306.

FIG. 8 is a chart 310 illustrating the output voltage, represented by the vertical axis 312, produced by each main amplifier 314 and the auxiliary amplifier 316. To add around 3 dB to the high efficiency region of the system, the impedance at the output of the main amplifier is increased by an amount equal to $$1 - \sqrt{2}\frac{V_{aux}}{V_{main\_sat}},$$

which, for $V_{main\_sat} = V_{aux}$ is 2.414. Looking at Equation 1, a voltage ratio, $V_{aux}/V_{main\_sat}$, of $$\frac{1}{1+\sqrt{2}} = 0.414$$

will achieve the desired impedance. Accordingly, at and below the first voltage value 304, the auxiliary amplifier is operated in phase with the main amplifiers at a voltage 0.414 of the voltage of the main amplifier. At this ratio, the impedance of load at the output of the main amplifiers is increased by a factor of 2.414. At the first input voltage value 304, the main amplifiers are driven in saturation, where they remain up to the maximum input voltage 306.

The voltage of the auxiliary amplifier is reduced until the auxiliary amplifier is mute at the second input voltage value 305. For values larger than the second input voltage value 305, the auxiliary amplifier is driven out-of-phase with the main amplifier at a linearly increasing voltage until the maximum voltage, 306 is reached. It will be appreciated that the auxiliary amplifier can be operated in class B or class AB to provide the desired linear response.

FIG. 9 is a chart 320 illustrating the normalized impedance 322 at the outputs of the main amplifiers, represented by the vertical axis 324. So long as the auxiliary amplifier is maintained in phase with the main amplifier and at a voltage 0.414 times that of the main amplifier, the impedance is increased by a factor of 2.414. Once the main amplifier reaches saturation at the first input voltage value 304, the voltage of the auxiliary amplifier is reduced, with an accompanying reduction in the impedance. When the auxiliary amplifier is mute at the second input voltage value 305, the impedance returns to the nominal value. When the auxiliary amplifier is operated out-of-phase with the main amplifier, at input voltages above the second input voltage, the impedance is reduced as the output voltage of the auxiliary amplifier increases, until the auxiliary amplifier reaches saturation. At this point, a minimum impedance of 0.414 is achieved.

FIG. 10 is a chart 330 illustrating the normalized output power, represented by the vertical axis 332, produced by the two main amplifiers, in combination, 334 and the system as a whole 336. It will be appreciated that, in the absence of the auxiliary amplifier, the system should produce two watts on the normalized scale. Due to the increase in load impedance at the main amplifier outputs caused by the auxiliary amplifier, it will be appreciated that less than half of the expected power for two main amplifiers operating in saturation is provided at the first input voltage value 304.

As the voltage of the auxiliary amplifier is reduced, the power output by the system increases until the auxiliary amplifier is mute at the second input voltage value 305. At this point, the main amplifiers produce the expected normalized two watts. As the auxiliary amplifier begins producing an output out-of-phase with the main amplifiers, the power produced by the system 336 increases, as the impedance at the main amplifiers is reduced and the contribution of the auxiliary amplifier is combined with the main amplifier output 334. At the maximum input voltage 306, the system power 336 represents one watt provided by the auxiliary amplifier and the main amplifier output 334, augmented by the decrease in load impedance provided by the auxiliary amplifier.

Figure 11:
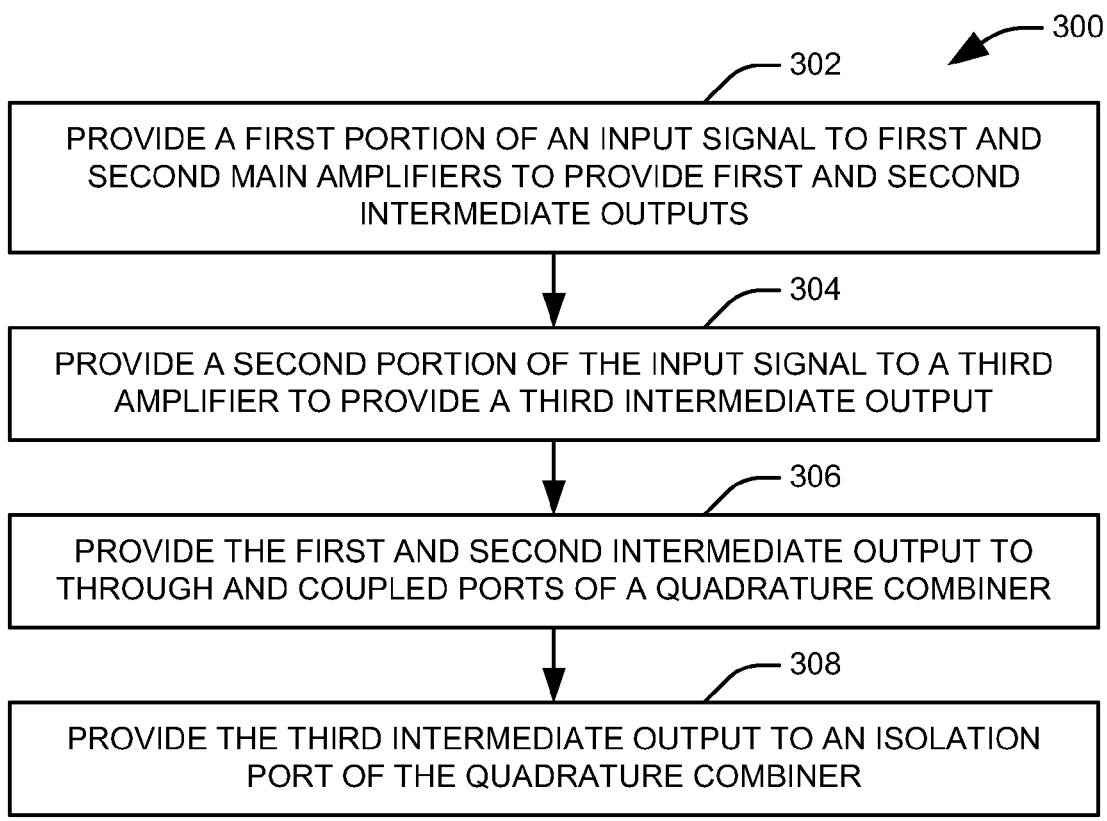
FIG. 11 illustrates a first methodology for amplifying a signal in accordance with an aspect of the present invention.

FIG. 11 illustrates a first method 400 for amplifying an input signal in accordance with an aspect of the present invention. At 402, a first portion of the input signal is provided to first and second main amplifiers to provide first and second intermediate outputs. At 404, a second portion of the input signal is provided to an auxiliary amplifier to provide a third intermediate output. In one implementation, the second portion of the input signal is provided to the third amplifier only when the amplitude of the input signal exceeds a threshold value, and the amplifier is mute when the amplitude of the input signal is below the threshold value. In another implementation, the second portion of the input signal is provided such that the outputs of the amplifiers are in phase with the first portion of the input signal when the amplitude of the input signal is below a threshold value and provided such that the output of the auxiliary amplifier is one hundred eighty degrees out-of-phase with the output of the main amplifiers when the amplitude of the input signal is above the threshold value.

At 306, the first and second intermediate outputs are provided to through and coupled ports of a quadrature combiner. At 308, the third intermediate output is provided to an isolation port of the quadrature combiner.

Figure 12:
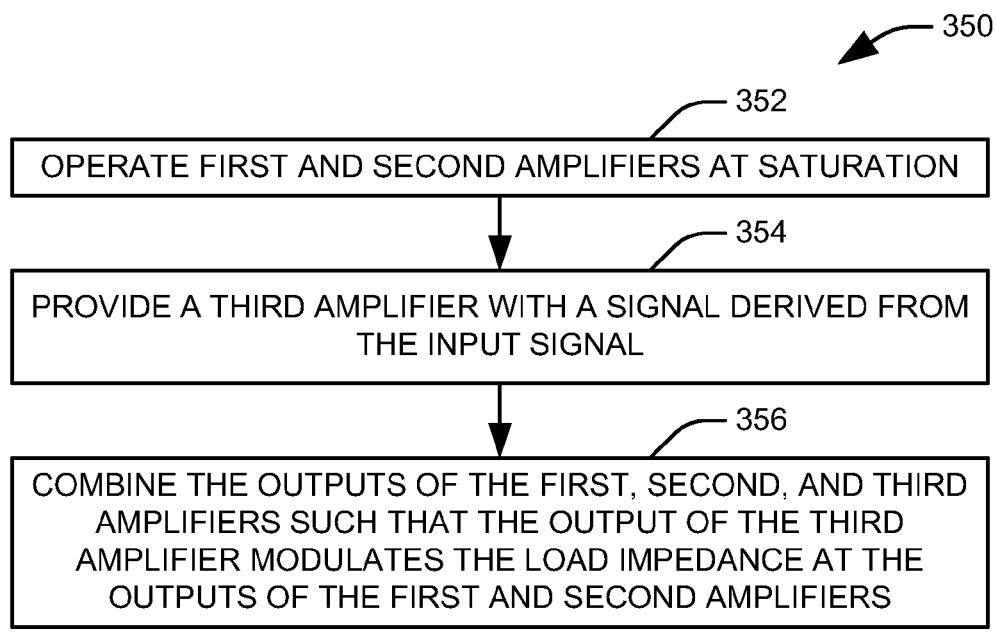
FIG. 12 illustrates a second methodology for amplifying a signal in accordance with an aspect of the present invention.

FIG. 12 illustrates a first method 350 for amplifying an input signal in accordance, with an aspect of the present invention. At 352, first and second amplifiers are operated at saturation. At 354, a third amplifier is provided with a signal derived from the input signal. At 356, the outputs of the first, second, and third amplifiers are combined as to modulate the load impedance at the outputs of the first and second amplifiers with the output of the third amplifier. For example, the output of the first and second amplifiers can be provided to through and coupled ports of a quadrature combiner, and the output of the third amplifier can be provided to an isolation port of the quadrature combiner.

In accordance with an aspect of the present invention, the output of the third amplifier can modulate the impedance of the load in accordance with the amplitude of the input signal. In one instantiation, the output of the third amplifier is provided to the isolation port in phase with the output of the first and second amplifiers, such that the load impedance at the outputs of the first and second amplifiers is increased. This can be done, for example, to allow the first and second amplifiers to operate in saturation, and thus more efficiently, even when the amplitude of the input signal is below the value at which the amplifiers would ordinarily be driven to saturation. In another instantiation, the output of the third amplifier is provided to the isolation port out-of-phase with the outputs of the first and second amplifiers, such that the load impedance at the outputs of the first and second amplifier is decreased, increasing the power output by the system.

From the above description of the invention, those skilled in the art will perceive improvements, changes, and modifications. Such improvements, changes, and modifications within the skill of the art are intended to be covered by the appended claims.

Having described the invention we claim:

1. A system for modulating a radio frequency (RF) carrier signal with a baseband signal and amplifying the modulated RF carrier signal to provide an amplified RF signal, the system comprising:

a quadrature combiner configured to provide an output signal at an associated output port;

a first main amplifier configured to receive a first modulated RF signal and provide a first output to a through port of the quadrature combiner;

a second main amplifier configured to receive the first modulated RF signal and provide a second output to a coupled port of the quadrature combiner;

an auxiliary amplifier configured to receive a second modulated RF signal and provide a third output to an isolation port of the quadrature combiner; and an RF modulator configured to provide the first modulated RF signal and the second modulated RF signal, the RF modulator comprising a phase shifter that can be used to continuously adjust the phase of the second modulated RF signal relative to the first modulated RF signal.

2. The system of claim 1, the system further comprising a quadrature splitter configured to distribute the first modulated RF signal to the first main amplifier and the second main amplifier.

3. The system of claim 2, further comprising a first driver amplifier connected to the quadrature splitter and a second driver amplifier connected to the auxiliary amplifier.

4. The system of claim 2, wherein the quadrature splitter is a two-way 3 dB ninety degree directional coupler.

5. The system of claim 1, wherein the desired phase difference between the first modulated RF signal and the second modulated RF signal is selected such that a phase difference between the first output signal and the third output signal at an output port of an active device inside of the first main amplifier is one hundred eighty degrees.

6. The system of claim 1, the RF modulator comprising an amplitude distorter that distorts the baseband input signal along a signal path associated with the auxiliary amplifier such that the second modulated RF signal has a non-zero amplitude only when the baseband input signal exceeds a predetermined threshold amplitude at which the first and second main amplifiers reach voltage saturation.

7. The system of claim 1, wherein the quadrature combiner is a two-way 3 dB ninety degree directional coupler.

8. The system of claim 1, wherein the first and second main amplifiers operate in class AB and the auxiliary amplifier operates in class C.

9. The system of claim 1, wherein each of the first main amplifier, the second main amplifier, and the auxiliary amplifier operate in class AB.

10. A method for modulating an RF carrier signal with a baseband input signal and amplifying the modulated RF carrier signal, comprising:
   providing a first modulated RF signal to a first main amplifier to provide a main output;
   providing a second modulated RF signal to an auxiliary amplifier to provide an auxiliary output;
   providing the main output to one of a through port and a coupled port of a quadrature combiner;
   providing the first modulated RF signal to a second main amplifier to provide a second main output;
   providing the second main output to an other of the through port and the coupled port of the quadrature combiner; and
   providing the auxiliary output to an isolation port of the quadrature combiner;
   wherein each of the first main amplifier, the second main amplifier, and the auxiliary amplifier operate in class AB.

11. The method of claim 10, wherein providing the second modulated RF signal to the auxiliary amplifier to provide the auxiliary output comprises providing the second modulated RF signal to the auxiliary amplifier only when an amplitude of the baseband input signal exceeds a threshold value.

12. A system for modulating a radio frequency (RF) carrier signal with a baseband input signal and amplifying the modulated RF carrier signal to provide an amplified RF signal, the system comprising:
   a quadrature combiner configured to provide the amplified RF signal at an associated output port;
   a main amplifier configured to receive a first modulated RF signal and provide a main output to one of a through port and a coupled port of the quadrature combiner; and
   an auxiliary amplifier configured to receive a second modulated RF signal and provide an auxiliary output to an isolation port of the quadrature combiner; and
   an RF modulator that modulates the RF carrier signal with the baseband input signal on first and second signal paths to produce the first and second modulated RF signals, the RF modulator comprising:
   a first predistorter configured to provide amplitude and phase predistortion to the baseband input signal on the first signal path to correct for distortion present at the output of the quadrature combiner; and
   a second predistorter configured to provide amplitude and phase predistortion to the baseband input signal on the second signal path to correct for distortion introduced by the auxiliary amplifier.

13. The system of claim 12, further comprising a second main amplifier configured to receive the first modulated RF signal and provide a second main output to an other of the through port and the coupled port of the quadrature combiner.

14. The system of claim 13, the system further comprising a quadrature splitter configured to distribute the first modulated RF signal between the first main amplifier and the second main amplifier.

15. The system of claim 12, each of the first predistorter and the second predistorter being configured to provide adaptive predistortion, with the first predistorter receiving feedback from the output port of the quadrature combiner and the second predistorter receiving feedback from the output of the auxiliary amplifier.

16. A method for modulating an RF carrier signal with a baseband input signal and amplifying the modulated RF carrier signal, comprising:
   providing a first modulated RF signal to a main amplifier to provide a main output;
   providing a second modulated RF signal to an auxiliary amplifier to provide an auxiliary output such that the auxiliary output is in phase with the main output at an output of an active device within the main amplifier when an amplitude of the input signal is below a threshold value and the auxiliary output is out-of-phase with the main output when the amplitude of the input signal is above the threshold value;
   providing the main output to one of a through port and a coupled port of a quadrature combiner; and
   providing the auxiliary output to an isolation port of the quadrature combiner.

\* \* \* \* \*